(12) United States Patent
Hada et al.

(10) Patent No.: US 7,141,909 B2
(45) Date of Patent: Nov. 28, 2006

(54) SURFACE ACOUSTIC WAVE DEVICE

(75) Inventors: Takuo Hada, Nagaokakyo (JP);
Takeshi Nakao, Nagaokakyo (JP);
Michio Kadota, Kyoto (JP); Osamu Nakagawara, Rittou (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 217 days.

(21) Appl. No.: 10/834,596

(22) Filed: Apr. 29, 2004

(65) Prior Publication Data

US 2004/0256950 A1 Dec. 23, 2004

(30) Foreign Application Priority Data

Jun. 17, 2003 (JP) .............................. 2003-171671
Apr. 5, 2004 (WO) ...................... PCT/JP04/04896

(51) Int. Cl.
*H01L 41/047* (2006.01)
*H01L 41/16* (2006.01)
*H03H 9/145* (2006.01)
*H03H 9/25* (2006.01)
*H03H 9/15* (2006.01)

(52) U.S. Cl. .................................. 310/313 R; 310/364
(58) Field of Classification Search ............ 310/313 R, 310/363, 364
See application file for complete search history.

(56) References Cited

U.S. PATENT DOCUMENTS 5,844,347 A 12/1998 Takayama et al.
6,424,075 B1 * 7/2002 Inoue et al. ............. 310/313 R
6,545,388 B1 * 4/2003 Iwamoto .................. 310/313 A
6,657,366 B1 * 12/2003 Watanabe et al. ........... 310/634
2002/0038985 A1 4/2002 Iwamoto
2003/0164529 A1 * 9/2003 Inoue et al. ................. 257/414
2004/0108560 A1 * 6/2004 Taga .......................... 257/416

FOREIGN PATENT DOCUMENTS

| JP | 52-1040 U | | 6/1975 | |
| JP | 5-22067 | * | 1/1993 | ............. 310/313 A |
| JP | 07-122961 | | 5/1995 | |
| JP | 08-227656 | | 9/1996 | |
| JP | 09-069748 | | 3/1997 | |
| JP | 09-098043 | | 4/1997 | |
| JP | 09-199976 | | 7/1997 | |
| JP | 10-79638 | * | 3/1998 | |
| JP | 2002-026685 | | 1/2002 | |
| JP | 2002-043888 | | 2/2002 | |
| JP | 2003-152498 | | 5/2003 | |
| JP | 2003-243961 | | 8/2003 | |

* cited by examiner

*Primary Examiner*—Thomas M. Dougherty
(74) *Attorney, Agent, or Firm*—Keating & Bennett, LLP (57) ABSTRACT

A surface acoustic wave device includes a piezoelectric substrate and interdigital electrodes disposed on the piezoelectric substrate, wherein each of the interdigital electrodes includes a main electrode layer made of Cu or an alloy that has Cu as its main component. The surface acoustic wave device also includes a tightly adhering layer which is disposed between the main electrode layer and the piezoelectric substrate and whose main component is NiCr, or a tightly adhering layer whose main component is Ti and whose film thickness is within a range of about 18 nm to about 60 nm.

21 Claims, 8 Drawing Sheets

SURFACE ACOUSTIC WAVE DEVICE

BACKGROUND OF THE INVENTION

1. Field of the Invention

The present invention relates to a surface acoustic wave device for use, for example, as a resonator, a filter, or other such device, and more specifically, relates to a surface acoustic wave device in which interdigital electrodes are constructed using Cu as the main material.

2. Description of the Related Art

Surface acoustic wave devices are electronic components utilizing surface acoustic waves propagated by mechanical vibration energy being concentrated only in the vicinity of a solid surface. A surface acoustic wave device generally has a piezoelectric substrate and interdigital electrodes disposed on the piezoelectric substrate, and is used as a filter or a resonator.

Al or an Al-type alloy using Al as the main component, which is low in electrical resistivity and low in specific gravity, has generally been used as the material constituting the electrodes in a surface acoustic wave device. However, with electrodes made of Al or an Al-type alloy, short-circuiting of electrodes is caused due to stress migration, and insertion loss tends to increase. Furthermore, the power resistance is not sufficient, either.

For the purposes of the following discussion, Patent Reference 1 is Japanese Patent Application Kokai No. H9-98043, Patent Reference 2 is Japanese Patent Application Kokai No. H9-199976, and Patent Reference 3 is Japanese Patent Application Kokai No. 2002-26685.

The use of Cu as the electrode material in a surface acoustic wave device is proposed in Patent References 1 through 3 listed below. Specifically, in the surface acoustic wave device described in Patent Reference 1, interdigitated electrodes are constructed from copper or a copper alloy whose main component is copper.

Furthermore, electrodes for the surface acoustic wave element described in Patent Reference 2 are constructed from an alloy having the composition $Cu_xM_y$. Here, x and y are values expressed by weight percentage, and the metal M is a metal selected from among Zn, Ni, Sn, Al, Mg, and other suitable metals. It is indicated that a Cu alloy including Zn, Ni, Sn, Al, Mg, or other suitable metal is used to achieve an improvement in electrode oxidation resistance.

In addition, it is disclosed in Patent Reference 2 that the electrode oxidation resistance is further increased by forming an inorganic protective layer such as SiON, $SiO_2$, and $Al_2O_3$ on the electrodes made of a Cu alloy.

In the surface acoustic wave element described in Patent Reference 3, on the other hand, a first electrode layer composed of Ti or a Ti alloy with a thickness of 10 nm is disposed on the piezoelectric substrate, a second electrode layer composed of Cu or a Cu alloy is disposed on the first electrode layer, and a third electrode layer disposed of Al, an alloy whose main component is Al, Au, or an alloy whose main component is Au is arranged so as to cover the second electrode layer. It is indicated that the provision of a first electrode layer composed of Ti or a Ti alloy makes it possible to increase the adhesion between the piezoelectric substrate and electrodes, and the formation of a third electrode layer makes it possible to increase the oxidation resistance in the surface acoustic wave device described in Patent Reference 3.

Electrodes composed of Cu have the problem of insufficient adhesion to the piezoelectric substrate. Furthermore, because Cu is susceptible to oxidation, the electrodes composed of Cu also have the problem of insufficient oxidation resistance.

In view of this, a protective film consisting of an inorganic insulating material such as SiON and $SiO_2$ is disposed on the electrodes in the surface acoustic wave device described in above-mentioned Patent Reference 2, in order to increase oxidation resistance. Furthermore, an alloy of Cu with an element such as Zn, Ni, and Sn is used in the method described in Patent Reference 2.

Meanwhile, with the recent trend toward higher frequencies in communication devices, an increasingly higher power resistance has been required particularly in filters and splitters used on the transmission side of communication devices. Accordingly, a higher adhesion between the electrodes and piezoelectric substrate has been strongly desired.

In the surface acoustic wave devices described in Patent References 1 and 2, the adhesion of the electrodes to the piezoelectric substrate is insufficient, so that it is difficult to achieve an improvement in power resistance.

In the surface acoustic wave element described in Patent Reference 3, furthermore, although the adhesion between the piezoelectric substrate and the electrodes is increased by the formation of the first electrode layer consisting of Ti or a Ti alloy having a thickness of about 10 nm, an adequate power resistance could not be obtained even with such a structure.

SUMMARY OF THE INVENTION

In order to overcome the problems described above, preferred embodiments of the present invention provide a surface acoustic wave device which has electrodes mainly composed of a Cu electrode layer, in which the adhesion of these electrodes to the piezoelectric substrate is significantly increased, and in which a high power resistance is achieved.

According to a preferred embodiment of the present invention, a surface acoustic wave device includes a piezoelectric substrate and interdigital electrodes disposed on the piezoelectric substrate, and each of the interdigital electrodes has a main electrode layer made of Cu or an alloy that has Cu as its main component and a tightly adhering layer that is disposed between the main electrode layer and the substrate and the tightly adhering layer has NiCr as its main component.

The thickness of the tightly adhering layer is preferably within a range of about 5 nm to about 50 nm, for example.

The thickness of the tightly adhering layer that is normalized by the wavelength of the surface acoustic wave is preferably within a range of about 0.0025 to about 0.025, for example.

According to a second preferred embodiment of the present invention, a surface acoustic wave device includes a piezoelectric substrate and interdigital electrodes disposed on the piezoelectric substrate, each of the interdigital electrodes includes a main electrode layer made of Cu or an alloy that has Cu as its main component and a tightly adhering layer that is disposed between the main electrode layer and the substrate and that has Ti as its main component, and the thickness of the tightly adhering layer is within a range of about 18 nm to about 60 nm.

According to a third preferred embodiment of the present invention, a surface acoustic wave device includes a piezoelectric substrate and interdigital electrodes disposed on the piezoelectric substrate, each of the interdigital electrodes includes a main electrode layer made of Cu or an alloy that has Cu as its main component and a tightly adhering layer that is disposed between the main electrode layer and the substrate and that has Ti as its main component, and the thickness of the tightly adhering layer that is normalized by the wavelength of the surface acoustic wave is within a range of about 0.009 to about 0.03.

According to a fourth preferred embodiment of the present invention, a surface acoustic wave device includes a piezoelectric substrate and interdigital electrodes disposed on the piezoelectric substrate, and each of the above-mentioned interdigital electrodes includes a main electrode layer made of Cu or an alloy that has Cu as its main component and a tightly adhering layer that is disposed between the main electrode layer and the substrate and that has Cr as its main component.

According to a fifth preferred embodiment of the present invention, a surface acoustic wave device includes a piezoelectric substrate and interdigital electrodes disposed on the piezoelectric substrate, and each of the above-mentioned interdigital electrodes includes a main electrode layer made of Cu or an alloy that has Cu as its main component and a tightly adhering layer that is disposed between the main electrode layer and the substrate and that has Ni as its main component.

According to a sixth preferred embodiment of the present invention, a surface acoustic wave device includes a piezoelectric substrate and interdigital electrodes disposed on the piezoelectric substrate, and each of the interdigital electrodes includes a main electrode layer made of Cu or an alloy that has Cu as its main component and a tightly adhering layer that is disposed between the main electrode layer and the substrate and that has Al—Cu as its main component.

A protective layer may be laminated on the main electrode layer and the protective layer preferably has a main component that is a metal that is less susceptible to oxidization than Cu. The protective layer may be composed of an Al—Cu alloy. Preferably, an auxiliary electrode layer composed of Ti or NiCr is disposed between the protective layer and the main electrode layer.

Also, an $SiO_2$ film may be arranged so as to cover the interdigital electrodes.

Other features, elements, characteristics, and advantages of the present invention will become more apparent from the following detailed description of preferred embodiments thereof with reference to the attached drawings.

DETAILED DESCRIPTION OF PREFERRED EMBODIMENTS

The present invention will be described in detail below by describing preferred embodiments of the present invention with reference to figures.

Figure 1:
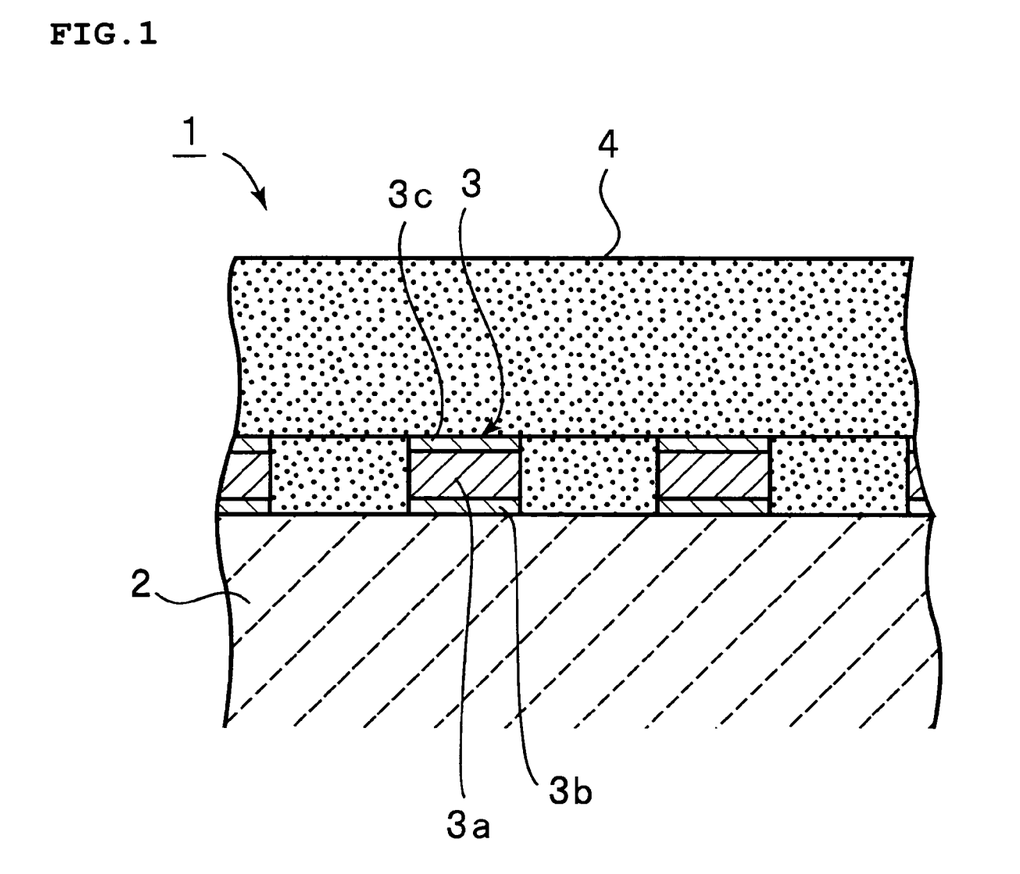
FIG. 1 is a model sectional front view for illustrating the electrode structure of a preferred embodiment of the surface acoustic wave device of the present invention.

FIG. 1 is a model sectional front view showing the electrode structure of the surface acoustic wave device according to a preferred embodiment of the present invention. A surface acoustic wave device 1 has a piezoelectric substrate 2. The piezoelectric substrate 2 is preferably constructed from a 36°-rotated Y-cut-plate X-propagating $LiTaO_3$ substrate in the present preferred embodiment. Of course, the piezoelectric material forming the piezoelectric substrate in various preferred embodiments of the present invention may also be a $LiTaO_3$ substrate having another rotational angle. Furthermore, the piezoelectric substrate 2 may also be constructed from another piezoelectric single crystal such as $LiNbO_3$ and a quartz crystal, or other suitable material.

Interdigital electrodes 3 are provided on the piezoelectric substrate 2. The interdigital electrodes 3 have a plurality of electrode fingers. One of the unique characteristics of the surface acoustic wave device 1 of the present preferred embodiment is that each of the interdigital electrodes 3 has a main electrode layer 3a, a tightly adhering layer 3b disposed between the main electrode layer 3a and the piezoelectric substrate 2, and a protective layer 3c laminated on the top surface of the main electrode layer 3a. Furthermore, it is not absolutely necessary to provide a protective layer 3c in various preferred embodiments of the present invention.

The main electrode layer 3a is preferably made of Cu or an alloy whose main component is Cu. In the present preferred embodiment, this layer is preferably constructed from Cu. As is described above, electrodes made of Cu or an alloy whose main component is Cu have the problem of inadequate adhesion to the piezoelectric substrate. In the surface acoustic wave device 1, the tightly adhering layer 3b is provided in order to improve this adhesion.

In the present preferred embodiment, furthermore, the tightly adhering layer 3b is preferably made from an NiCr alloy. As will be clear from the examples described later, the tightly adhering layer 3b made of NiCr effectively improves the adhesion of the interdigital electrodes 3 to the piezoelectric substrate 2.

Furthermore, the protective layer 3c is formed from a material whose main component is a metal that is less susceptible to oxidization than Cu. Examples of metal materials forming such a protective layer include metals or alloys such as Al, Ti, Cr, Ni, Pt, Pd, NiCr, and AlCu. Other suitable metals may also be used.

Preferably, the protective layer is composed of an Al—Cu alloy to enhance the power resistance without greatly affecting the frequency characteristics. When the protective layer is composed of elemental aluminum having high corrosion resistance, the interdiffusion between copper in the main electrode layer and aluminum occurs in the power handling test, and thus the resulting device rarely exhibits sufficient power resistance. This is due to the fact that the activation energies for the interdiffusion coefficients of copper and aluminum are low.

In contrast, the protective layer composed of an Al—Cu alloy can yield good power resistance and resistance to organic solvents. In particular, since heat energy and oscillation energy are consumed in the intermigration in the Al—Cu alloy in the power handling test, the interlayer diffusion between the main electrode layer and the protective layer is prevented. Accordingly, formation of the Al—Cu protective layer can increase the power resistance without greatly affecting the frequency characteristics.

Moreover, in order to more efficiently prevent the interdiffusion between the Al—Cu protective layer and the Cu main electrode layer, an auxiliary electrode layer composed of Ti or NiCr is preferably disposed between the Al—Cu protective layer and the Cu main electrode layer. This can lead to improvements in power resistance. Moreover, an $SiO_2$ layer 4 is preferably arranged so as to cover the interdigital electrodes 3 in the surface acoustic wave device 1. The $SiO_2$ layer 4 is provided in order to improve the frequency-temperature characteristics in the surface acoustic wave device 1. In addition, it is preferable that the surface of the $SiO_2$ layer 4 be flattened. Of course, it is not absolutely necessary to provide an $SiO_2$ layer 4 in the surface acoustic wave device of preferred embodiments of the present invention.

Next, the efficient increase in the adhesion of the interdigital electrodes to the piezoelectric substrate and in power resistance in the surface acoustic wave device of preferred embodiments of the present invention is described based on specific examples.

EXAMPLE 1

The tightly adhering layer 3b made of NiCr is formed to a thickness of about 20 nm on a 36°-rotated Y-cut-plate X-propagating $LiTaO_3$ substrate, for example. Furthermore, an electrode film made of Cu and having a normalized film thickness $h/\lambda_W$ of about 0.030, i.e., a thickness of about 60 nm, is formed as the main electrode layer 3a, for example. Here, h is the thickness (nm) of the main electrode layer, and $\lambda_W$ is the wavelength (nm) of the surface acoustic wave determined by the pitch of the interdigital electrodes 3. Furthermore, the protective layer 3c is constructed from various types of metal, and the thickness thereof is preferably about 10 nm. Moreover, the electrode pitch is preferably about 1 nm, and the width of the electrode fingers is preferably about 0.5 nm.

Furthermore, a surface acoustic wave device in which the above-mentioned protective layer 3c is not formed, and surface acoustic wave devices provided with the protective layer 3c including various types of metal, are prepared. In addition, a surface acoustic wave device is prepared in which an $SiO_2$ film is formed to a normalized thickness $hs/\lambda_W$ of about 0.10 so as to cover the interdigital electrodes. Here, hs is the thickness (nm) of the $SiO_2$ film.

A power handling test is conducted on the respective surface acoustic wave devices prepared as described above. In the power handling test, the attenuation-frequency characteristics are measured while applying electric power to the surface acoustic wave devices. In specific terms, approximately 0.1 W of electric power is applied as the initial electric power, the power is increased in a stepwise manner, and the electric power at which the minimum insertion loss point of the attenuation-frequency characteristics is confirmed to have deteriorated by about 0.5 dB or more is taken as the breakdown power. The electric power application time in each step is preferably about 5 minutes.

Figure 2:
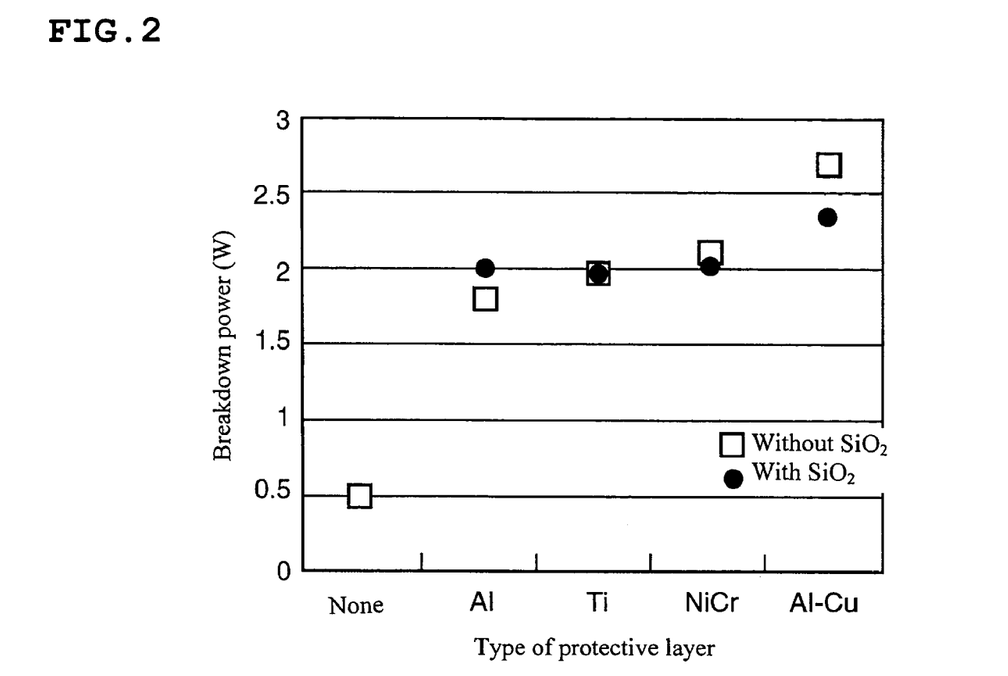
FIG. 2 is a graph showing the magnitude of the breakdown power in the surface acoustic wave devices prepared in Example 1 in cases where no protective layer is provided and in cases where the material of the protective layer is varied.
Figure 3:
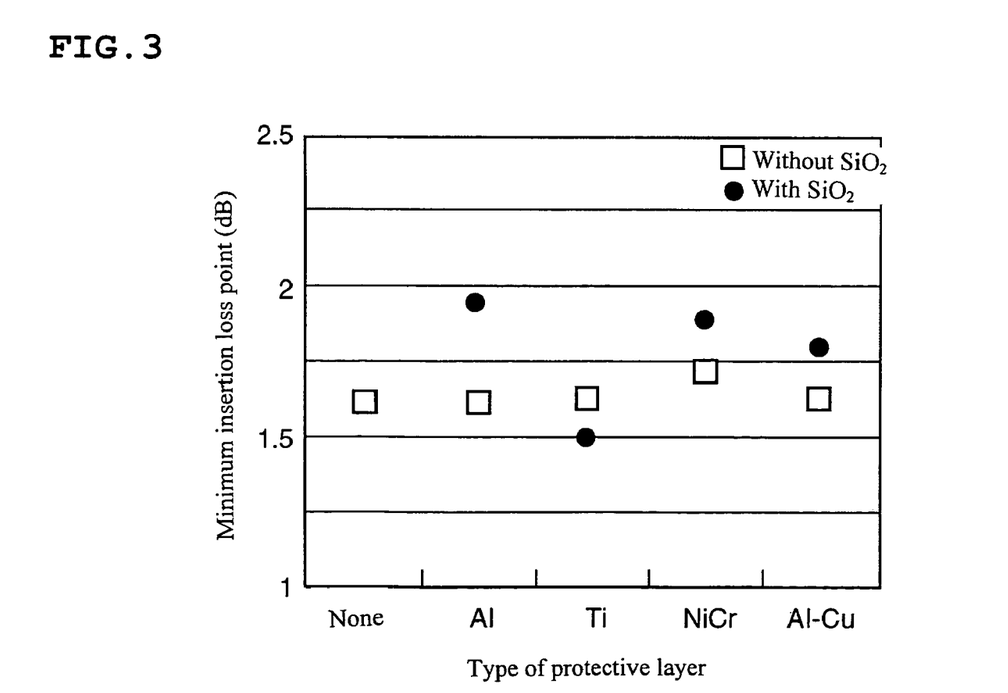
FIG. 3 is a graph showing the magnitude of the minimum insertion loss point in terms of attenuation-frequency characteristics in the respective surface acoustic wave devices prepared in Example 1 in cases where no protective layer is provided and in cases where the material of the protective layer is varied.

FIG. 2 is a graph illustrating the relationship between the type of protective layer in the surface acoustic wave device and the breakdown power determined as described above. FIG. 3 is a graph illustrating the relationship between the type of protective layer and the above-mentioned minimum insertion loss point.

As is clearly seen from FIG. 2, in cases where the protective layer 3c that acts to suppress the oxidation of Cu is provided, the breakdown power is conspicuously larger than in cases where no protective layer is provided. Accordingly, it is discovered that the power resistance can be effectively improved by the formation of the protective layer 3c. Furthermore, FIG. 2 shows a case in which no protective layer is provided and cases in which Al, Ti, NiCr, and AlCu are used as the materials forming the protective layer 3c. However, it is confirmed that the breakdown power can also be increased in the same way when the protective layer is constructed using another metal that is less susceptible to oxidization than Cu, such as Cr, Ni, Pt, and Pd.

Specifically, it is seen from the results shown in FIG. 2 that when the protective layer 3c is formed from a metal having an oxidation resistance that is superior to Cu in order to increase the oxidation resistance, not only can the oxidation resistance be increased, but the power resistance can also be effectively increased.

On the other hand, as is apparent from FIG. 3, when the above-mentioned protective layer 3c is formed, the amount of the minimum insertion loss itself is not much different from the case in which no protective layer 3c is provided. It is understood that the power resistance can be effectively improved by forming the protective layer 3c, without greatly affecting the frequency characteristics of the surface acoustic wave device 1.

Furthermore, as is clearly seen from FIG. 2, the power resistance is hardly changed from the case in which an $SiO_2$ film is formed as compared to the case in which no $SiO_2$ film is formed. Moreover, it is found that the minimum insertion loss point is also hardly changed from the case in which an SiO$_2$ film is formed as compared to the case in which no SiO$_2$ film is formed as is clear from FIG. 3. Accordingly, it is seen that a surface acoustic wave device that is superior not only in the power resistance and adhesion, but also in the frequency-temperature characteristics can preferably be provided by forming the SiO$_2$ film 4.

Furthermore, it is preferable that when the SiO$_2$ film is formed, a protective layer 3c made of a material with a favorable adhesion to SiO$_2$ (e.g., Ti) be formed.

EXAMPLE 2

Next, a power handling test is conducted in the same manner as in Example 1 by varying the film thickness of the tightly adhering layer 3b. Surface acoustic wave devices are constructed in the same way as in the case with Example 1. However, NiCr or Ti is used as the material for the tightly adhering layer 3b, and the respective film thicknesses are varied. Furthermore, the main electrode layer 3a is formed from a Cu film with a normalized film thickness h/$\lambda_W$ of about 0.030, i.e., a thickness of about 60 nm, and an Al film with a thickness of about 10 nm is formed as the protective layer 3c.

Figure 4:
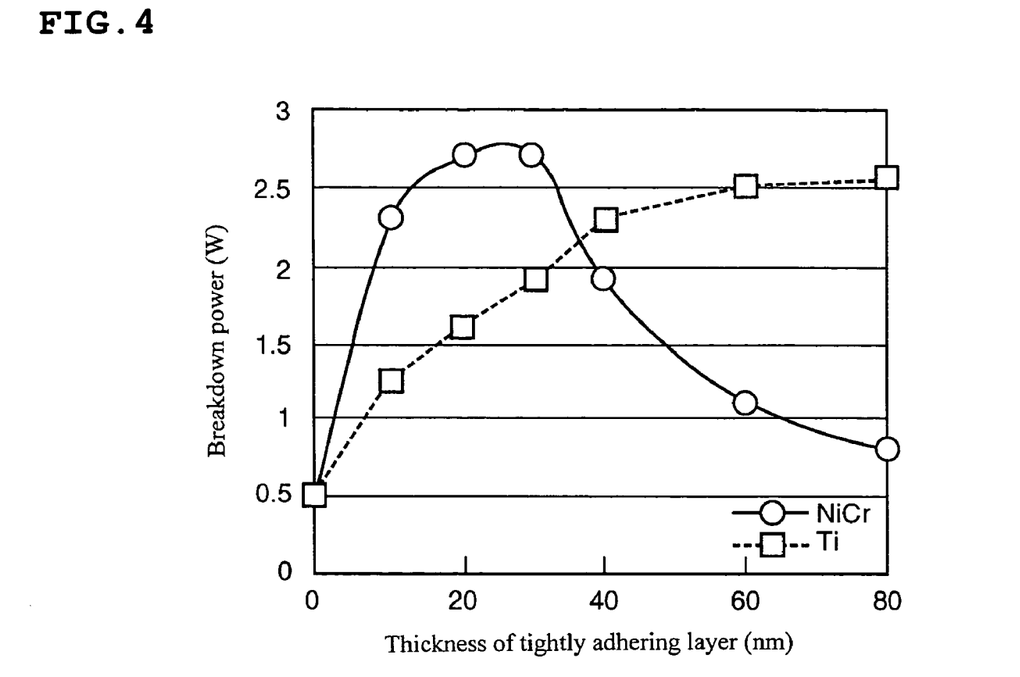
FIG. 4 is a graph showing the variations in breakdown power in cases where the thickness of the tightly adhering layer is varied in Example 2.
Figure 5:
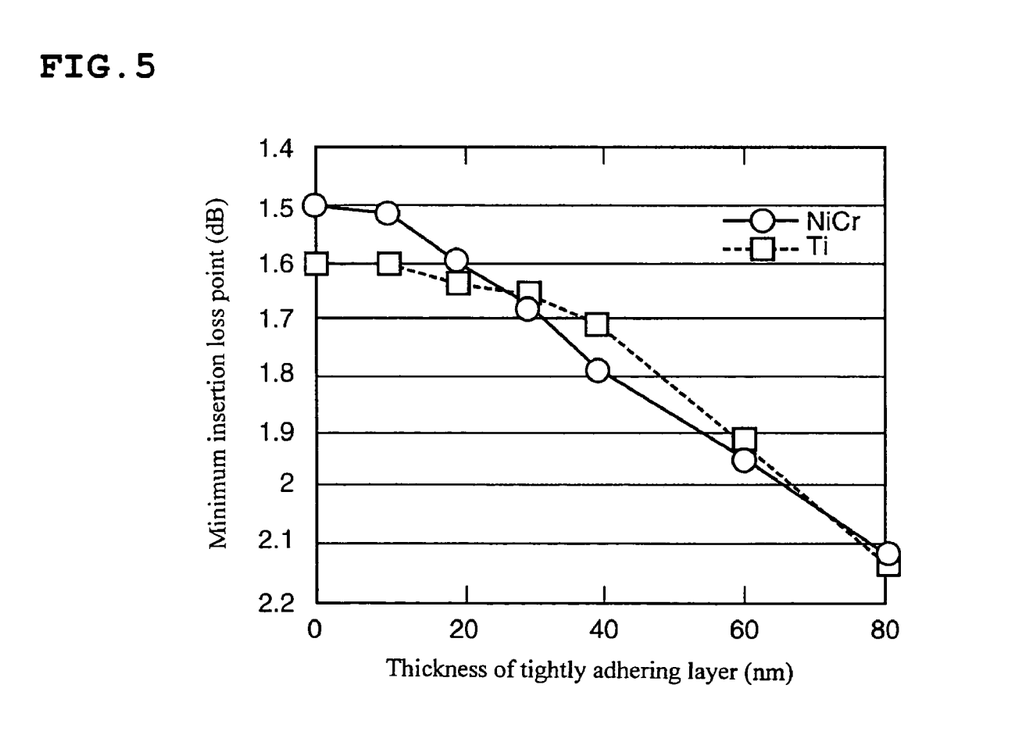
FIG. 5 is a graph showing the variations in the minimum insertion loss point in terms of attenuation-frequency characteristics in cases where the thickness of the tightly adhering layer is varied in Example 2.

FIG. 4 and FIG. 5 are graphs showing the variations in breakdown power in cases where the thickness of the above-mentioned tightly adhering layer 3b is varied, and FIG. 5 is a graph showing the variations in the above-mentioned minimum insertion loss point in cases where the thickness of the tightly adhering layer is varied.

As is apparent from FIG. 4, when the tightly adhering layer 3b made of NiCr or Ti is formed, the power resistance can be increased compared to the case in which no tightly adhering layer 3b is formed (i.e., thickness of the tightly adhering layer=0 nm). Furthermore, as is clear from FIG. 5, the minimum insertion loss point increases as the thickness of the tightly adhering layer increases.

It is desirable that the minimum insertion loss point be about 2.0 dB or lower, and the power resistance is determined as approximately 1.5 W or higher from the standpoint of the use in the transmission stage of a communication device. Accordingly, as evidenced from the results shown in FIG. 4 and FIG. 5, it is desirable that the thickness of the tightly adhering layer made of NiCr be about 5 nm to about 50 nm and that the normalized film thickness h/$\lambda_W$ preferably be in a range of about 0.0025 to about 0.025 in order to construct a favorable surface acoustic wave device 1 with the formation of a tightly adhering layer made of NiCr.

In cases where a tightly adhering layer 3b made of Ti is provided, on the other hand, the power resistance can be increased as the thickness of the tightly adhering layer 3b is increased, as evidenced in FIG. 4. Furthermore, the minimum insertion loss point tends to deteriorate as the film thickness increases in the case of forming the tightly adhering layer made of Ti as well.

Accordingly, it is desirable (from FIG. 4) that the thickness of the tightly adhering layer be about 18 nm to about 60 nm and that the normalized film thickness h/$\lambda_W$ be about 0.009 to about 0.03 in order to achieve a power resistance of approximately 1.5 W or higher and a minimum insertion loss point of about 2.0 dB or lower with the formation of the tightly adhering layer made of Ti.

As is clearly seen from Example 2, the power resistance can effectively be increased when the tightly adhering layer made of NiCr or Ti is formed as the base layer for the main electrode layer whose main component is Cu, and the power resistance can be increased to approximately 1.5 W or higher especially by setting the thickness of the tightly adhering layer in the above-mentioned desirable range.

Furthermore, as is clearly seen from Example 1 described above, when the protective layer 3c is provided, not only can the oxidation resistance be improved, but the above-mentioned power resistance can also be increased even more effectively, without deteriorating the minimum insertion loss.

Moreover, the tightly adhering layer 3b is preferably made of NiCr or Ti in Example 2, but a metal material whose main component is NiCr or Ti may also be used. Furthermore, the tightly adhering layer may also be formed from Cr, Ni, Al—Cu, or other suitable material.

EXAMPLE 3

Figure 10:
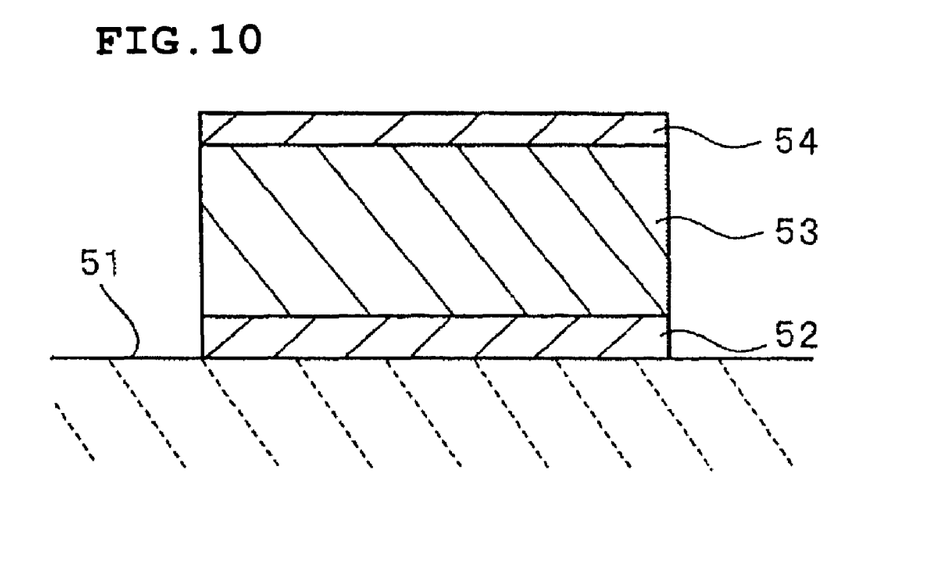
FIG. 10 is a sectional front view for illustrating the electrode structure of a preferred embodiment of the surface acoustic wave device of the present invention.

A tightly adhering layer composed of Ti having a thickness of about 20 nm was formed on a 36°-rotated Y-cut-plate X-propagating LiTaO$_3$ substrate. An electrode film composed of Cu and having a normalized film thickness H/$\lambda_W$ of about 0.030, i.e., a thickness of about 60 nm, was formed as the main electrode layer on the tightly adhering layer. H represents the thickness (nm) of the main electrode layer, and $\lambda_W$ represents the wavelength (nm) of the surface acoustic wave determined by the pitch of the interdigital electrodes. Next, a protective layer, i.e., an Al-1 wt. % Cu alloy film having a thickness of about 10 nm, was formed on the main electrode layer. The cross-sectional structure of the resulting electrode is shown in FIG. 10. As shown in FIG. 10, a tightly adhering layer 52, a main electrode layer 53, and a protective layer 54 were stacked in that order on a LiTaO$_3$ substrate 51. Note that the drawing in FIG. 10 does not represent the actual thicknesses of these layers. The electrode pitch was about 1 µm, and the width of the electrode fingers was about 0.5 µm.

A surface acoustic device having the above-described structure, a surface acoustic device having the above-described structure but without the protective layer, and surface acoustic devices having the above-described structure but with protective layers composed of various materials instead of the Al-1 wt. % Cu alloy were prepared. The same power handling test was conducted on these devices as in Example 1. The results are shown in FIGS. 11 and 12.

Figure 11:
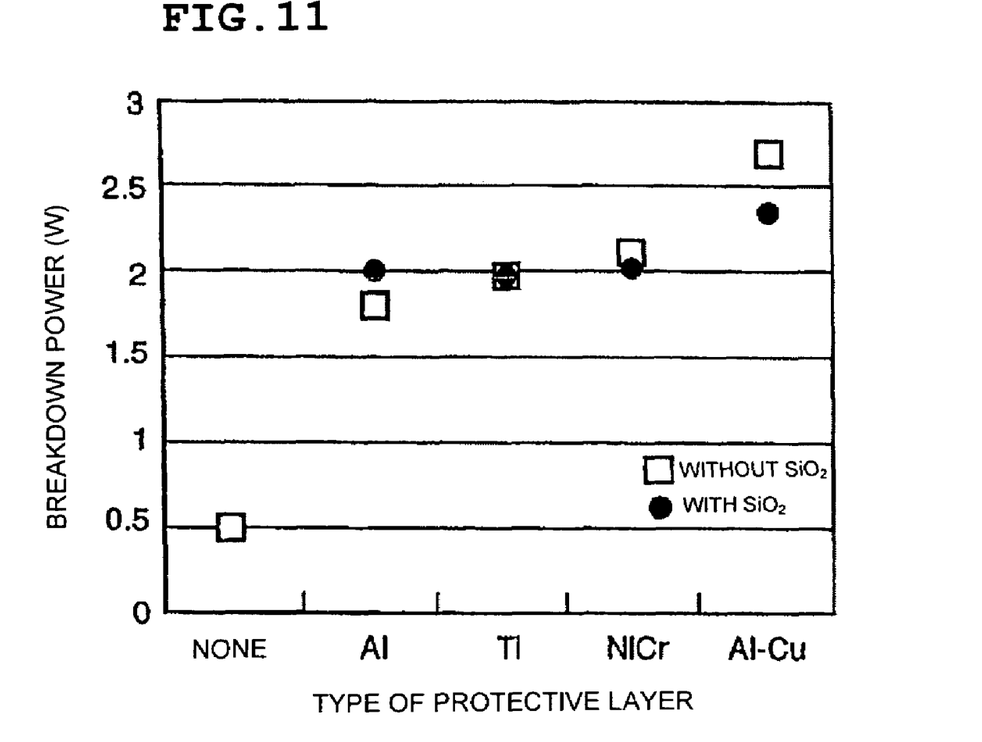
FIG. 11 is a graph showing various breakdown powers of surface acoustic wave devices for different materials used for the protective layer in the electrode structure shown in FIG. 10.

The abscissa in the graph of FIG. 11 indicates the type of metal used in the protective layer. In FIG. 11, solid circles indicate the results of those devices that included SiO$_2$ layers 4 covering the electrodes, as in Example 1. Open squares indicate the results of those devices having no SiO$_2$ layers.

As is apparent from FIG. 11, the power resistance was high when the protective layer was composed of the Li—Cu alloy regardless of whether the SiO$_2$ layer was formed. The increase in power resistance was particularly noticeable with the Li—Cu protective layer and without any SiO$_2$ layer.

Figure 12:
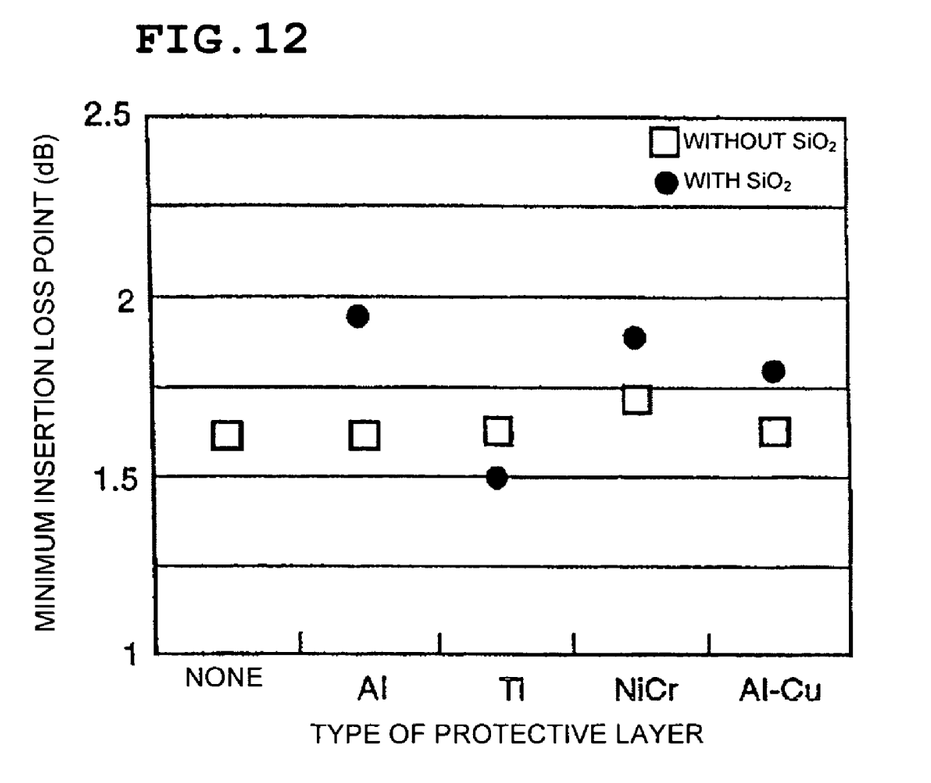
FIG. 12 is a graph showing various minimum insertion loss points of surface acoustic wave devices for different materials used for the protective layer in the electrode structure shown in FIG. 10.

As is apparent from FIG. 12, the minimum insertion loss point for the Al—Cu protective layer did not greatly differ from those of the device having no protective layer and the devices having protective layers composed of other materials, such as elemental aluminum. This shows that the formation of the Al—Cu protective layer efficiently increased the power resistance without greatly affecting the frequency characteristics of the surface acoustic wave device.

Figure 13:
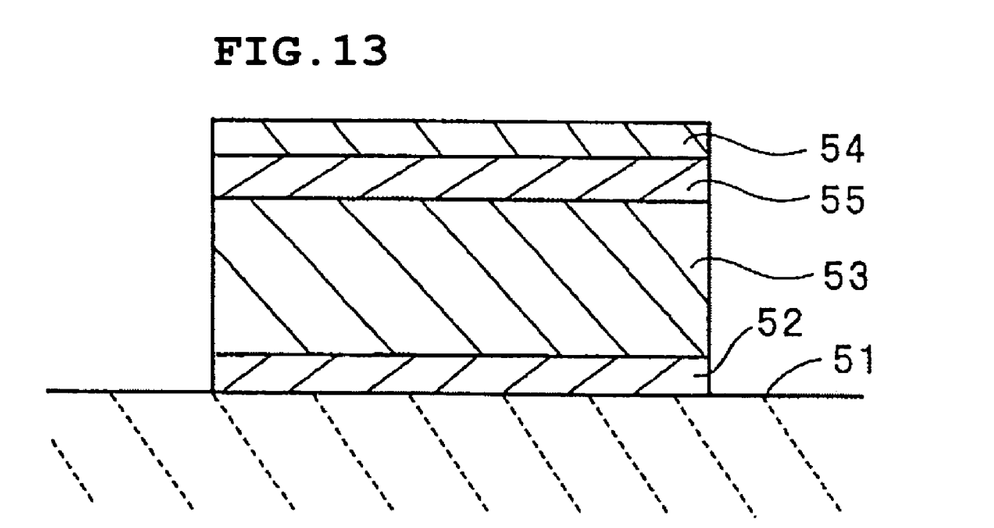
FIG. 13 is a sectional front view for illustrating the electrode structure of another preferred embodiment of the surface acoustic wave device of the present invention.

FIG. 13 is a schematic cross-sectional view of an electrode structure according to a more preferred embodiment of the surface acoustic wave device of the present invention. The drawing of FIG. 13 corresponds to the cross-sectional view of FIG. 10. The electrode structure shown in FIG. 13 includes an auxiliary electrode layer 55 composed of Ti or NiCr, which is disposed between the main electrode layer 53 composed of Cu and the protective layer 54 composed of an Al—Cu alloy. This structure enhances the power resistance.

The electrode structure of the surface acoustic wave device of preferred embodiments of the present invention preferably has a laminated structure as described above. However, the electrode structure of the surface acoustic wave device to which the present invention is applied is not particularly limited to such a structure. Accordingly, the surface shape of the interdigital electrodes can be appropriately modified in accordance with the desired type of surface acoustic wave device. FIGS. 6 through 9 are model plan views illustrating electrode structure examples of the surface acoustic wave device to which the present invention is applied.

Figure 6:
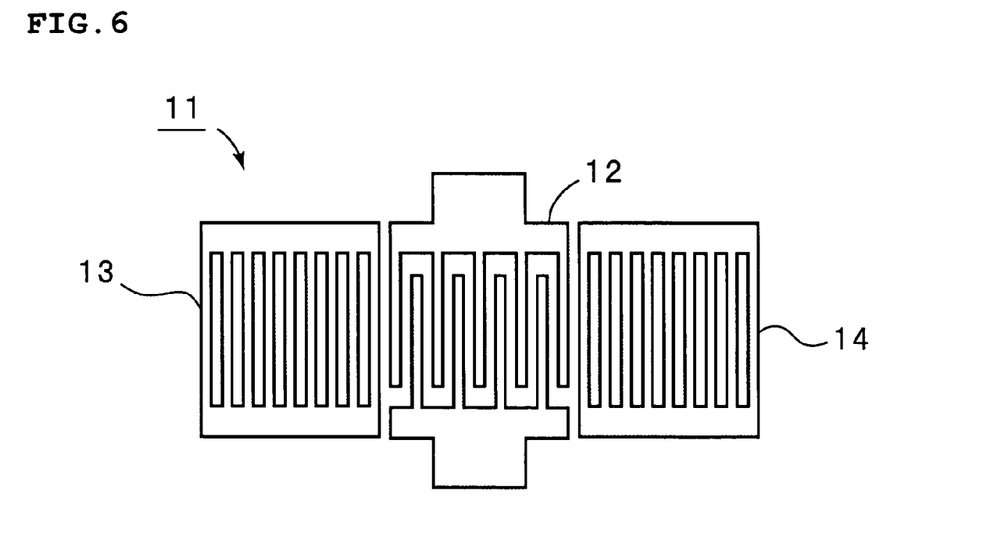
FIG. 6 is a plan view showing the electrode structure of a one-port surface acoustic wave resonator as one example of the surface acoustic wave device to which various preferred embodiments of the present invention are applied.

FIG. 6 shows the electrode structure of a one-port surface acoustic wave resonator 11. Here, reflectors 13 and 14 are disposed on either side of the interdigital electrode 12.

Figure 7:
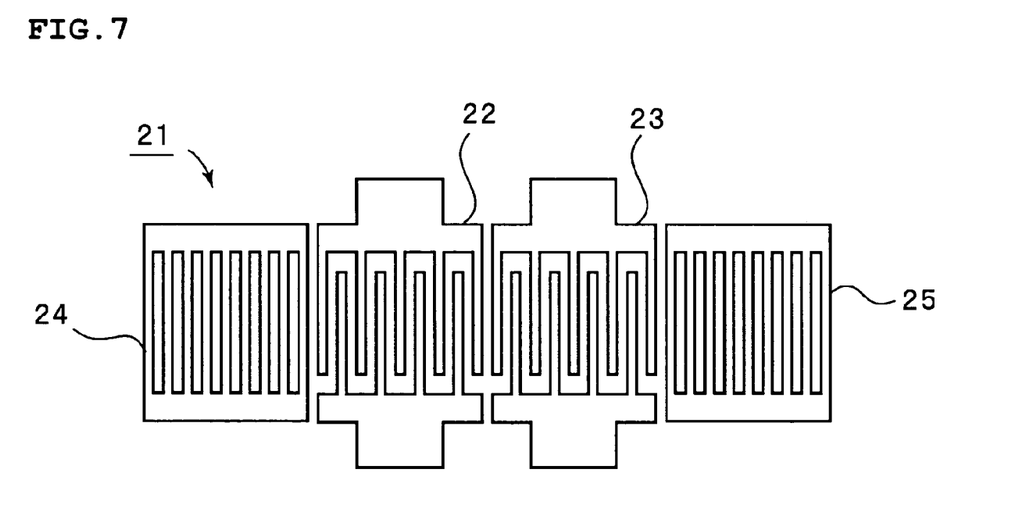
FIG. 7 is a plan view showing the electrode structure of a two-port surface acoustic wave resonator as another example of the surface acoustic wave device to which preferred embodiments of the present invention are applied.

Furthermore, FIG. 7 shows the electrode structure of a two-port surface acoustic wave resonator 21. Here, interdigital electrodes 22 and 23 are arranged substantially parallel to each other along the surface acoustic wave propagation direction. Reflectors 24 and 25 are disposed on either side of the interdigital electrodes 22 and 23.

Figure 8:
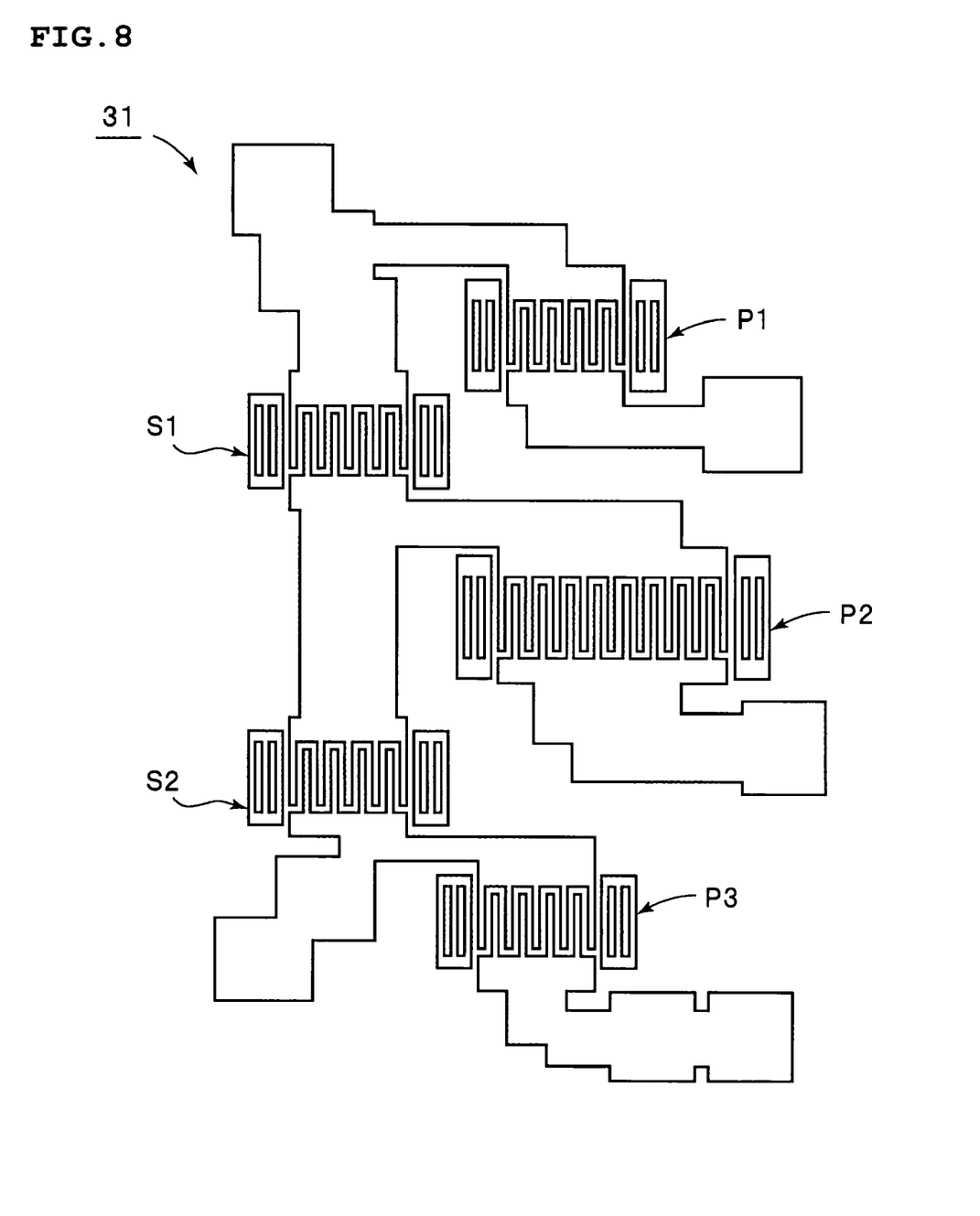
FIG. 8 is a model plan view showing the electrode structure of a ladder surface acoustic wave filter as yet another example of the surface acoustic wave device to which preferred embodiments of the present invention are applied.

FIG. 8 is a model plan view showing the electrode structure of a ladder surface acoustic wave filter 31. In the ladder surface acoustic wave filter 31, series resonators S1 and S2 and parallel resonators P1 through P3 are connected by connecting electrodes so as to have a ladder circuit structure. Each of the series resonators S1 and S2 and parallel resonators P1 through P3 is constructed from a one-port surface acoustic wave resonator.

Figure 9:
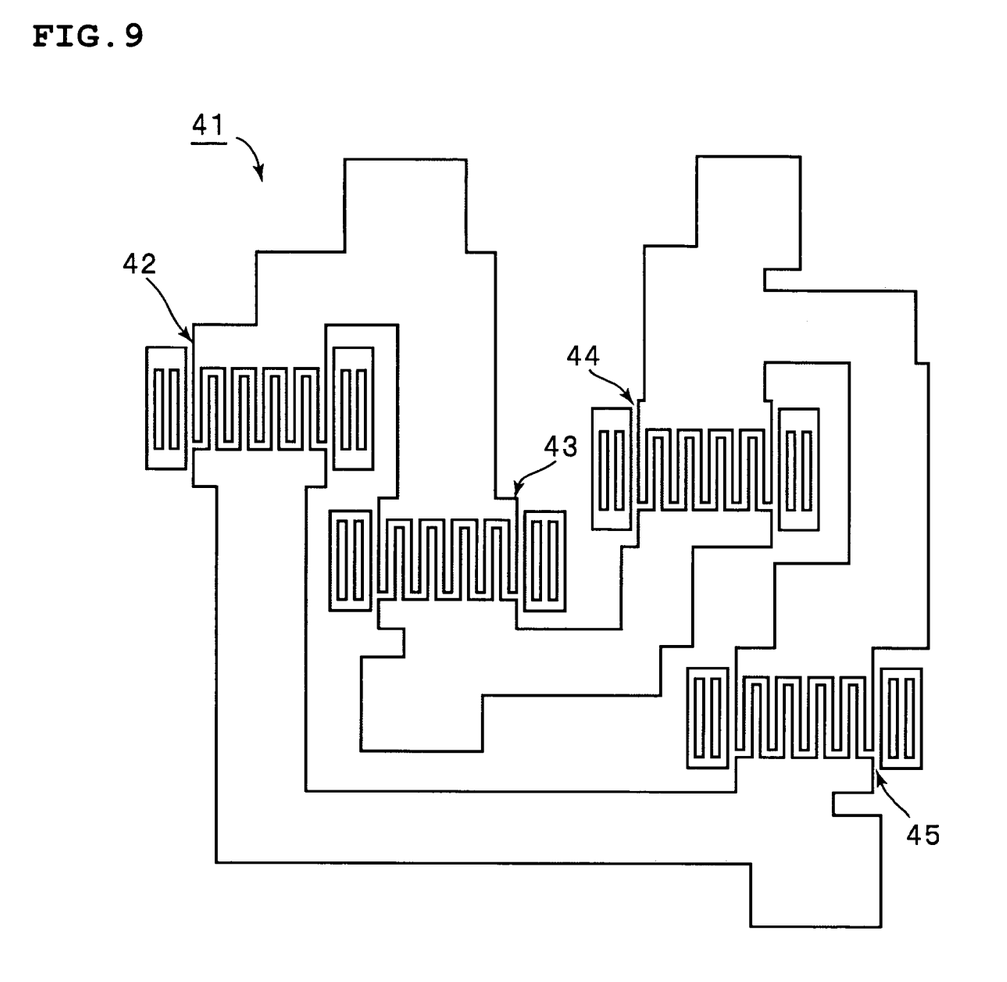
FIG. 9 is a model plan view showing the electrode structure of a lattice filter as still another example of the surface acoustic wave device to which preferred embodiments of the present invention are applied.

FIG. 9 illustrates the electrode structure of a lattice surface acoustic wave filter 41 as another example of the surface acoustic wave device to which the present invention is applied. In the lattice surface acoustic wave filter 41, one-port surface acoustic wave resonators 42 through 45 are electrically connected by connecting electrodes so as to make a lattice connection.

In the surface acoustic wave resonators 11 and 21 and the surface acoustic wave filters 31 and 41 shown in FIGS. 6 through 9 as well, the power resistance can be considerably increased without greatly affecting the frequency characteristics by forming the interdigital electrodes according to preferred embodiments of the present invention. Furthermore, by forming a protective layer as needed, not only can the oxidation resistance be increased, but the power resistance can also be increased even more effectively.

In the surface acoustic wave device according to the first preferred embodiment of the present invention, interdigital electrodes are provided on a piezoelectric substrate, and each of the interdigital electrodes has a main electrode layer made of Cu or an alloy that has Cu as its main component and a tightly adhering layer that is disposed between the main electrode layer and the substrate and that has NiCr as its main component. Accordingly, the power resistance can be effectively increased without greatly affecting the frequency characteristics and the like with the formation of this tightly adhering layer. In particular, when the thickness of the tightly adhering layer is within a range of about 5 nm to about 50 nm, or when the normalized thickness of the tightly adhering layer is within a range of about 0.0025 to about 0.025, it is possible to effectively increase the power resistance, for example, to approximately 1.5 W or higher without causing excessive deterioration in frequency characteristics.

In the surface acoustic wave device according to the second preferred embodiment of the present invention, interdigital electrodes are disposed on a piezoelectric substrate, each of the interdigital electrodes includes a main electrode layer made of Cu or an alloy that has Cu as its main component and a tightly adhering layer whose main component is Ti, and the thickness of the tightly adhering layer is about 18 nm to about 60 nm. Accordingly, the power resistance can be effectively increased without greatly affecting the frequency characteristics. In above-mentioned Patent Reference 3, a tightly adhering layer consisting of Ti is formed, but the thickness thereof is small (10 nm), so that sufficient power is not obtained. In the second preferred embodiment of the present invention, in contrast, because the thickness of the tightly adhering layer made of Ti is preferably about 18 nm or more as described above, it is possible to effectively increase the power resistance.

Similarly, because the normalized thickness of the tightly adhering layer whose main component is Ti is about 0.009 to about 0.03 in the third preferred embodiment of the present invention as well, the power resistance can be effectively increased.

In the fourth through sixth preferred embodiments of the present invention, because a tightly adhering layer whose main component is Cr, Ni, or Al—Cu is formed, the power resistance can be effectively increased in a similar manner.

In cases where a protective layer whose main component is a metal that is less susceptible to oxidization than Cu is provided on the main electrode layer in the first through sixth preferred embodiments of the present invention, not only can the oxidation resistance of the electrodes be increased, but the power resistance can also be increased even more effectively. Accordingly, it is possible to provide a surface acoustic wave device which is not only superior in oxidation resistance but also improves the power resistance even more.

When an $SiO_2$ film is formed so as to cover the interdigital electrodes, it is possible to improve the frequency-temperature characteristics of the surface acoustic wave device in which the power resistance is increased according to various preferred embodiments of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
   a piezoelectric substrate; and
   interdigital electrodes disposed on the piezoelectric substrate; wherein
   said interdigital electrodes include a main electrode layer made of one of Cu and an alloy that has Cu as its main component and an adhering leyer including NiCr as its main component, said adhering layer is disposed between said main electrode layer and the substrate;
   a protective layer is laminated on said main electrode layer and has a main component that is a metal that is less susceptible to oxidization than Cu; and
   an auxiliary electrode layer including one of Ti and NiCr is disposed between the protective layer and the main electrode layer.

2. The surface acoustic wave device according to claim 1, wherein the thickness of said adhering layer is within a range of about 5 nm to about 50 nm.

3. The surface acoustic wave device according to claim 1, wherein the thickness of said adhering layer that is normalized by the wavelength of the surface acoustic wave is within a range of about 0.0025 to about 0.025.

4. The surface acoustic wave device according to claim 1, wherein an $SiO_2$ film is arranged so as to cover said interdigital electrodes.

5. The surface acoustic wave device according to claim 1, wherein the protective layer includes an Al—Cu alloy.

6. A surface acoustic wave device comprising:
a piezoelectric substrate; and
interdigital electrodes disposed on the piezoelectric substrate; wherein
said interdigital electrodes include a main electrode layer made of one of Cu and an alloy that has Cu as its main component and an adhering layer including Ti as its main component, said adhering layer is disposed between said main electrode layer and the substrate;
the thickness of said adhering layer is within a range of about 18 nm to about 60 nm;
a protective layer is laminated on said main electrode layer and has a main component that is a metal that is less susceptible to oxidization than Cu; and
an auxiliary electrode layer including one of Ti and NiCr is disposed between the protective layer and the main electrode layer.

7. A surface acoustic wave device according to claim 6, wherein the thickness of said adhering layer that is normalized by the wavelength of the surface acoustic wave is within a range of about 0.009 to about 0.03.

8. The surface acoustic wave device according to claim 6, wherein the protective layer includes an Al—Cu alloy.

9. The surface acoustic wave device according to claim 6, wherein an $SiO_2$ film is arranged so as to cover said interdigital electrodes.

10. A surface acoustic wave device comprising:
a piezoelectric substrate; and
interdigital electrodes disposed on the piezoelectric substrate; wherein
said interdigital electrodes include a main electrode layer made of one of Cu and an alloy that has Cu as its main component and an adhering layer including Ti as its main component, said adhering layer is disposed between said main electrode layer and the substrate;
the thickness of said adhering layer that is normalized by the wavelength of the surface acoustic wave is within a range of about 0.009 to about 0.03;
a protective layer is laminated on said main electrode layer and has a main component that is a metal that is less susceptible to oxidization than Cu; and
an auxiliary electrode layer including one of Ti and NiCr is disposed between the protective layer and the main electrode layer.

11. The surface acoustic wave device according to claim 10, wherein the protective layer includes an Al—Cu alloy.

12. The surface acoustic wave device according to claim 10, wherein an $SiO_2$ film is arranged so as to cover said interdigital electrodes.

13. A surface acoustic wave device comprising:
a piezoelectric substrate; and
interdigital electrodes disposed on the piezoelectric substrate; wherein
said interdigital electrodes include a main electrode layer made of one of Cu and an alloy that has Cu as its main component and an adhering layer including Cr as its main component, said adhering layer is disposed between said main electrode layer and the substrate;
a protective layer is laminated on said main electrode layer and has a main component that is a metal that is less susceptible to oxidization than Cu; and
an auxiliary electrode layer including one of Ti and NiCr is disposed between the protective layer and the main electrode layer.

14. The surface acoustic wave device according to claim 13, wherein the protective layer includes an Al—Cu alloy.

15. The surface acoustic wave device according to claim 13, wherein an $SiO_2$ film is arranged so as to cover said interdigital electrodes.

16. A surface acoustic wave device comprising:
a piezoelectric substrate; and
interdigital electrodes disposed on the piezoelectric substrate; wherein
said interdigital electrodes include a main electrode layer made of one of Cu and an alloy that has Cu as its main component and an adhering layer including Ni as its main component, said adhering layer is disposed between said main electrode layer and the substrate;
a protective layer is laminated on said main electrode layer and has a main component that is a metal that is less susceptible to oxidization than Cu; and
an auxiliary electrode layer including one of Ti and NiCr is disposed between the protective layer and the main electrode layer.

17. The surface acoustic wave device according to claim 16, wherein the protective layer includes an Al—Cu alloy.

18. The surface acoustic wave device according to claim 16, wherein an $SiO_2$ film is arranged so as to cover said interdigital electrodes.

19. A surface acoustic wave device comprising:
a piezoelectric substrate; and
interdigital electrodes disposed on the piezoelectric substrate; wherein
said interdigital electrodes include a main electrode layer made of one of Cu and an alloy that has Cu as its main component and an adhering layer including Al—Cu as its main component, said adhering layer is disposed between said main electrode layer and the substrate;
a protective layer is laminated on said main electrode layer and has a main component that is a metal that is less susceptible to oxidization than Cu; and
an auxiliary electrode layer including one of Ti and NiCr is disposed between the protective layer and the main electrode layer.

20. The surface acoustic wave device according to claim 19, wherein the protective layer includes an Al—Cu alloy.

21. The surface acoustic wave device according to claim 19, wherein an $SiO_2$ film is arranged so as to cover said interdigital electrodes.

* * * * *